(12) United States Patent
Li et al.

(10) Patent No.: US 10,056,442 B2
(45) Date of Patent: Aug. 21, 2018

(54) ORGANIC LIGHT EMITTING DIODE ARRAY SUBSTRATE, METHOD FOR MANUFACTURING THE SAME AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Kun Li, Beijing (CN); Yun Qiu, Beijing (CN); Feng Bai, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 15/154,257

(22) Filed: May 13, 2016

(65) Prior Publication Data

US 2017/0025488 A1    Jan. 26, 2017

(30) Foreign Application Priority Data

Jul. 23, 2015 (CN) .......................... 2015 1 0437777

(51) Int. Cl.
*H01L 29/08* (2006.01)
*H01L 27/32* (2006.01)
*H01L 29/786* (2006.01)

(52) U.S. Cl.
CPC ........ *H01L 27/3248* (2013.01); *H01L 27/326* (2013.01); *H01L 27/3267* (2013.01); *H01L 27/3272* (2013.01); *H01L 29/78645* (2013.01)

(58) Field of Classification Search
CPC .......... C23C 16/4401; C23C 16/45504; C23C 16/45519; C23C 16/45578; C23C 16/50;
(Continued)

(56) References Cited

U.S. PATENT DOCUMENTS 6,521,913 B1   2/2003 Murade
7,622,863 B2 * 11/2009 Seo ....................... G09G 3/3216
                                                            257/100

(Continued)

FOREIGN PATENT DOCUMENTS

CN        1480914 A      3/2004
CN      102044554 A      5/2011
(Continued)

OTHER PUBLICATIONS

First Office Action regarding Chinese Application No. 201510437777.9, dated Aug. 1, 2017. Translation provided by Dragon Intellectual Property Law Firm.

*Primary Examiner* — Mohammed Shamsuzzaman
(74) *Attorney, Agent, or Firm* — Harness, Dickey & Pierce, P.L.C.

(57) ABSTRACT

An organic light emitting diode array substrate, a method for manufacturing the same and a display device are provided. The organic light emitting diode array substrate includes a base substrate, a first electrode layer, a first light emitting layer, a second electrode layer, a thin film transistor, a third electrode layer, a second light emitting layer, and a fourth electrode layer. A drain electrode of the thin film transistor is connected to the third electrode layer, the third electrode layer is connected to the second electrode layer, a light emission of the first light emitting layer is controlled by the first electrode layer and a second electrode layer, and the light emission of the second light emitting layer is controlled by the third electrode layer and the fourth electrode layer.

8 Claims, 1 Drawing Sheet

(58) Field of Classification Search
CPC . C23C 16/545; H01J 37/3244; H01J 37/3277; H01L 2227/323; H01L 2251/5323; H01L 27/3248; H01L 27/3272; H01L 29/78645
USPC .............. 257/40, 88; 428/690; 345/169; 313/500, 501
See application file for complete search history.

(56) References Cited

U.S. PATENT DOCUMENTS

| | | |
|---|---|---|
| 2003/0122125 A1 | 7/2003 | Murade |
| 2004/0245531 A1* | 12/2004 | Fuii .................. H01L 27/3267 257/88 |
| 2004/0263056 A1* | 12/2004 | Seo .................... G09G 3/3216 313/500 |
| 2005/0024339 A1* | 2/2005 | Yamazaki ............ G06F 1/1616 345/169 |
| 2005/0067945 A1* | 3/2005 | Nishikawa .......... H01L 51/5265 313/501 |
| 2008/0008905 A1* | 1/2008 | Yamazaki ........... G02F 1/13439 428/690 |
| 2009/0206727 A1 | 8/2009 | Kim |
| 2013/0200380 A1 | 8/2013 | Chang et al. |
| 2016/0020263 A1 | 1/2016 | Xu et al. |
| 2016/0260791 A1* | 9/2016 | Fleissner ............ H01L 27/3213 |

FOREIGN PATENT DOCUMENTS

| | | |
|---|---|---|
| CN | 103247656 A | 8/2013 |
| CN | 103730485 A | 4/2014 |

* cited by examiner

ORGANIC LIGHT EMITTING DIODE ARRAY SUBSTRATE, METHOD FOR MANUFACTURING THE SAME AND DISPLAY DEVICE

CROSS REFERENCE TO RELATED APPLICATION

This application claims priority to Chinese patent application No. 201510437777.9, filed with the Chinese State Intellectual Property Office on Jul. 23, 2015, which is incorporated herein by reference in its entirety.

FIELD

The present disclosure relates to the field of display technology, and in particular, to an organic light emitting diode array substrate, a method for manufacturing the same and a display device.

BACKGROUND

More attention is paid on display technology in which thin film transistors are used as control elements and organic light emitting diodes (OLEDs) are used as light emitting elements, since the display technology has advantages of high definition, wide viewing angle, easy achievement of curved and flexible display, and the relevant manufacturers conduct a large amount of researches and developments.

With the application of the organic light emitting diode display, double-sided display is needed in a growing number of occasions. An organic light emitting diode array substrate in a double-sided display in related technology has disadvantages of large thickness and high production cost.

SUMMARY

In view of the above, an organic light emitting diode array substrate, a method for manufacturing the same and a display device are provided in the present disclosure, which solve the issue in the related technologies that an organic light emitting diode array substrate for double-sided displaying has disadvantages of large thickness and high production cost.

An organic light emitting diode array substrate is provided in the present disclosure, which includes: a base substrate, a first electrode layer, a first light emitting layer, a second electrode layer, a thin film transistor, a third electrode layer, a second light emitting layer, and a fourth electrode layer. A drain electrode of the thin film transistor is connected to the third electrode layer, the third electrode layer is connected to the second electrode layer, light emission of the first light emitting layer is controlled by the first electrode layer and the second electrode layer, and light emission of the second light emitting layer is controlled by the third electrode layer and the fourth electrode layer.

Optionally, the organic light emitting diode array substrate further includes: a light shielding layer which is used to shield an active layer of the thin film transistor from light and arranged between the base substrate and the active layer the thin film transistor. A region of an orthographic projection of the active layer onto the base substrate is entirely located within a region of an orthographic projection of the light shielding layer onto the base substrate.

Optionally, an upper surface of the second electrode layer is flush with an upper surface of the light shielding layer, and the second electrode layer is made of a material identical to the light shielding layer.

Optionally, an upper surface of the third electrode layer is flush with upper surfaces of a source electrode and the drain electrode of the thin film transistor, and the third electrode layer, the source electrode and the drain electrode of the thin film transistor are made of an identical material.

Optionally, the second electrode layer is connected to the third electrode layer through a via hole.

Optionally, each of the first light emitting layer and the second light emitting layer emits light from a single side, and a direction of the light emitted by the first light emitting layer is opposite to a direction of the light emitted by the second light emitting layer.

Optionally, the first electrode layer is made of a transparent conductive material or a translucent conductive material, and the second electrode layer is made of an opaque conductive material.

Optionally, the fourth electrode layer is made of a transparent conductive material or a translucent conductive material, and the third electrode layer is made of an opaque conductive material.

Optionally, the organic light emitting diode array substrate further includes: a first pixel isolation layer, a light shielding layer, a buffer layer, an active layer, a gate insulating layer, a gate electrode, a dielectric interlayer, a source electrode, a drain electrode and a second pixel isolation layer. The first electrode layer is arranged on the base substrate. The first pixel isolation layer is arranged on the first electrode layer and includes multiple first pixel isolators and openings formed between the adjacent first pixel isolators. The first light emitting layer is arranged in the openings of the first pixel isolation layer. An upper surface of the second electrode layer is flush with an upper surface of the light shielding layer, and the second electrode layer is arranged on the first light emitting layer. The buffer layer is arranged on the second electrode layer and the light shielding layer. The active layer is arranged on the buffer layer, and a region of an orthographic projection of the active layer onto the base substrate is entirely located within a region of an orthographic projection of the light shielding layer onto the base substrate. The gate insulating layer is arranged on the active layer and the buffer layer. The gate electrode is arranged on the gate insulating layer. The dielectric interlayer is arranged on the gate insulating layer and the gate electrode. Upper surfaces of the source electrode, the drain electrode and the third electrode layer are flush with each other. The source electrode and the drain electrode are respectively connected to the active layer through via holes passing through the dielectric interlayer and the gate insulating layer, the drain electrode is connected to the third electrode layer, and the third electrode layer is connected to the second electrode layer through a via hole passing through the dielectric interlayer, the gate insulating layer and the buffer layer. The second pixel isolation layer is arranged on the dielectric interlayer, the source electrode, the drain electrode and the third electrode layer, and includes multiple second pixel isolators and openings formed between the adjacent second pixel isolators. The second light emitting layer is arranged in the openings of the second pixel isolation layer. The fourth electrode layer is arranged on the second light emitting layer.

An organic light emitting diode display device is further provided in the present disclosure, which includes the above-described organic light emitting diode array substrate.

A method for manufacturing an organic light emitting diode array substrate is further provided in the present disclosure, which includes: preparing a base substrate; and forming a first electrode layer, a first light emitting layer, a second electrode layer, a thin film transistor, a third electrode layer, a second light emitting layer, and a fourth electrode layer. A drain electrode of the thin film transistor is connected to the third electrode layer, the third electrode layer is connected to the second electrode layer, light emission of the first light emitting layer is controlled by the first electrode layer and the second electrode layer, and light emission of the second light emitting layer is controlled by the third electrode layer and the fourth electrode layer.

Optionally, before the step of forming the thin film transistor, the method further includes: forming a light shielding layer above the base substrate to shield an active layer of the thin film transistor from light. After the active layer of the thin film transistor is formed, a region of an orthographic projection of the active layer onto the base substrate is entirely located within a region of an orthographic projection of the light shielding layer onto the base substrate.

Optionally, the light shielding layer and the second electrode layer are formed by one patterning process.

Optionally, the source electrode and the drain electrode of the thin film transistor and the third electrode layer are formed by one patterning process.

Optionally, the step of forming a first electrode layer, a first light emitting layer, a second electrode layer, a thin film transistor, a third electrode layer, a second light emitting layer, and a fourth electrode layer includes: forming the first electrode layer on the base substrate; forming a first pixel isolation layer on the first electrode layer, where the first pixel isolation layer includes multiple first pixel isolators and openings formed between the adjacent first pixel isolators; forming the first light emitting layer in the openings of the first pixel isolation layer; forming the second electrode layer and a light shielding layer by one patterning process, where the second electrode layer is arranged on the first light emitting layer, and the light shielding layer is arranged in a region where an active layer is to be formed; forming a buffer layer on the second electrode layer and the light shielding layer; forming the active layer on the buffer layer, where a region of an orthographic projection of the active layer onto the base substrate is entirely located within a region of an orthographic projection of the light shielding layer onto the base substrate; forming a gate insulating layer on the active layer and the buffer layer; forming a gate electrode on the gate insulating layer; forming a dielectric interlayer on the gate insulating layer and the gate electrode, forming via holes passing through the dielectric interlayer and the gate insulating layer, and forming a via hole passing through the dielectric interlayer, the gate insulating layer and the buffer layer; forming a source electrode, the drain electrode and the third electrode layer by one patterning process, where the source electrode and the drain electrode are respectively connected to the active layer through the via holes passing through the dielectric interlayer and the gate insulating layer, the drain electrode is connected to the third electrode layer, and the third electrode layer is connected to the second electrode layer through the via hole passing through the dielectric interlayer, the gate insulating layer and the buffer layer; forming a second pixel isolation layer on the interlayer dielectric layer, the source electrode, the drain electrode and the third electrode layer, where the second pixel isolation layer includes multiple second pixel isolators and openings formed between the adjacent second pixel isolators; forming the second light emitting layer in the openings of the second pixel isolation layer; and forming the fourth electrode layer on the second light emitting layer.

The above-described technical solutions of the present disclosure have beneficial effects as follows.

Two organic light emitting diodes in each pixel unit of the organic light emitting diode array substrate for double-sided displaying are driven by one thin film transistor to emit lights; hence, compared with the organic light emitting diode array substrate for double-sided displaying in the related technologies, the number of thin film transistors in each pixel unit is reduced by one, and accordingly, the thickness and production cost are reduced. Moreover, an aperture ratio of the organic light emitting diode array substrate for double-sided displaying may be increased since the number of thin film transistors in each pixel unit is reduced by one.

Figure 1:
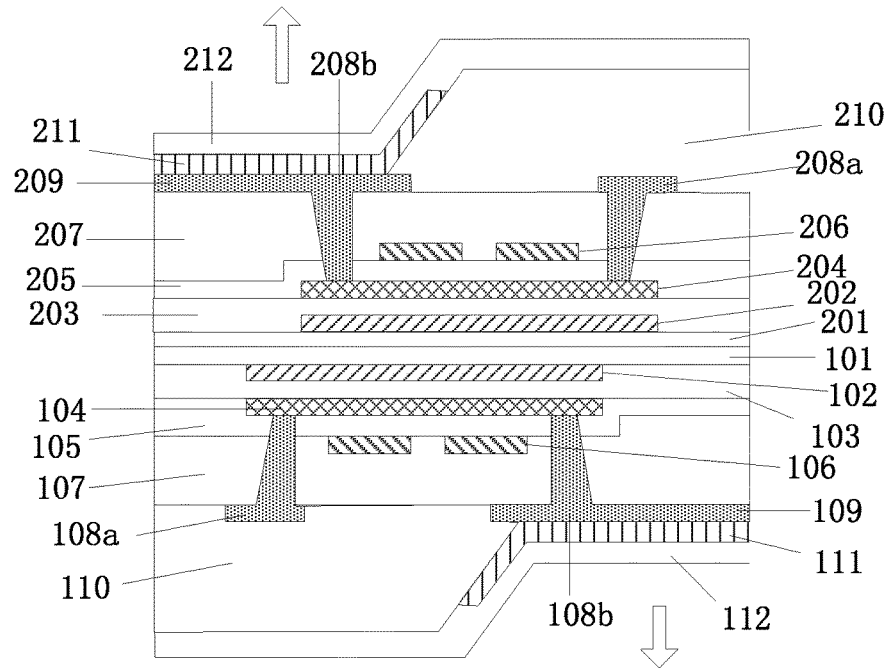
FIG. 1 is a schematic structural diagram of an organic light emitting diode array substrate in a double-sided display in related technology.

Brief description of reference numerals is as follows.

Figure 2:
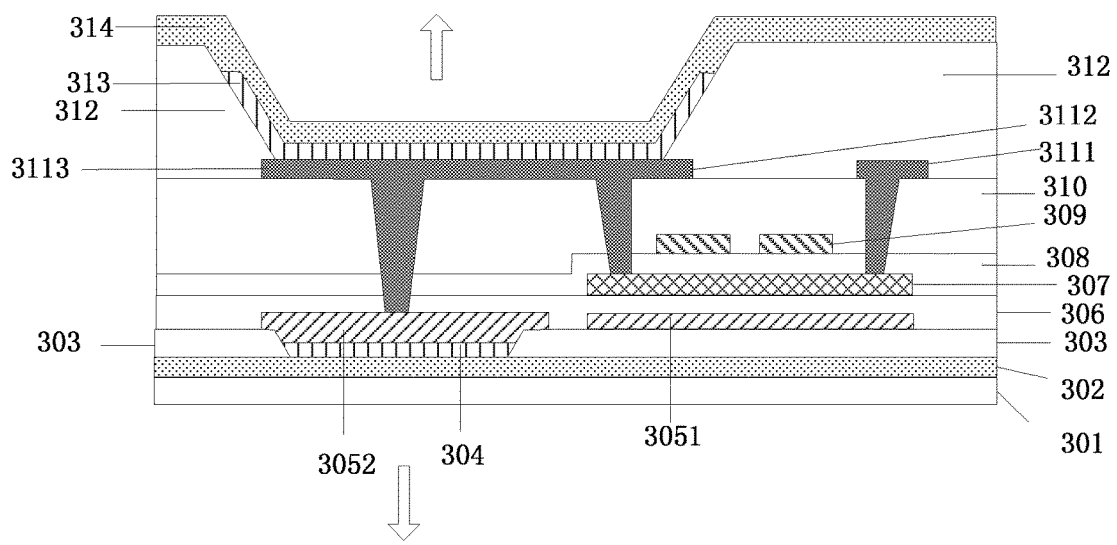
FIG. 2 is a schematic structural diagram of an organic light emitting diode array substrate in a double-sided display according to some embodiments of the present disclosure.

In FIG. 1,

101, 201 base substrates; 102, 202 light shielding layers; 103, 203 buffer layers; 104, 204, active layers; 105, 205 gate insulating layers; 106, 206 gate electrodes; 107, 207 dielectric interlayers; 108a, 208a source electrodes; 108b, 208b drain electrodes; 109, 209 anodes; 110, 210 pixel isolation layers; 111, 211 organic light emitting layers; 112, 212 cathodes;

in FIG. 2,

301 base substrate; 302 first electrode layer; 303 first pixel isolation layer; 304 first light emitting layer; 3051 light shielding layer; 3052 second electrode layer; 306 buffer layer; 307 active layer; 308 gate insulating layer; 309 gate electrode; 310 dielectric interlayer; 3111 source electrode; 3112 drain electrode; 3113 third electrode layer; 312 second pixel isolation layer; 313 second light emitting layer; 314 fourth electrode layer.

DETAILED DESCRIPTION OF THE EMBODIMENTS

Reference is made to FIG. 1, which is a schematic structural diagram of an organic light emitting diode array substrate for double-sided displaying in related technology. The organic light emitting diode array substrate for double-sided displaying is manufactured by attaching a first organic light emitting diode array substrate for single-sided displaying to a second organic light emitting diode array substrate for single-sided displaying. The first organic light emitting diode array substrate includes a base substrate 101, a light shielding layer 102, a buffer layer 103, an active layer 104, a gate insulating layer 105, a gate electrode 106, a dielectric interlayer 107, a source electrode 108a, a drain electrode 108b, an anode 109, a pixel isolation layer 110, an organic light emitting layer 111, and a cathode 112. The second organic light emitting diode array substrate includes a base substrate 201, a light shielding layer 202, a buffer layer 203, an active layer 204, a gate insulating layer 205, a gate electrode 206, a dielectric interlayer 207, a source electrode 208a, a drain electrode 208b, an anode 209, a pixel isolation layer 210, an organic light emitting layer 211, and a cathode 212. Directions of lights respectively emitted by the two organic light emitting diode array substrates for single-sided displaying are indicated by arrows shown in FIG. 1.

In order to solve the issue in related technology that the organic light emitting diode array substrate for double-sided displaying has disadvantages of large thickness and high production cost, an organic light emitting diode array substrate is provided according to some embodiments of the present disclosure, which includes: a base substrate; a first electrode layer formed on the base substrate, a first light emitting layer, a second electrode layer, a thin film transistor, a third electrode layer, a second light emitting layer, and a fourth electrode layer. A drain electrode of the thin film transistor is connected to the third electrode layer, the third electrode layer is connected to the second electrode layer, and the light emission of the second light emitting layer is controlled by the third electrode layer and the fourth electrode layer.

The light emission of the first light emitting layer is controlled by the first electrode layer and the second electrode layer. That is, a first organic light emitting diode includes the first electrode layer, the first light emitting layer and the second electrode layer, the first electrode layer serves as a cathode of the first organic light emitting diode, and the second electrode layer serves as an anode of the first organic light emitting diode. The first organic light emitting diode emits light from one side, the cathode is made of a transparent conductive material or a translucent conductive material, and the anode is made of an opaque conductive material.

The light emission of the second light emitting layer is controlled by the third electrode layer and the fourth electrode layer. That is, a second organic light emitting diode includes the third electrode layer, the second light emitting layer and the fourth electrode layer, the third electrode layer serves as an anode of the second organic light emitting diode, and the fourth electrode layer serves as a cathode of the second organic light emitting diode. The second organic light emitting diode emits light from one side, the cathode is made of a transparent conductive material or a translucent conductive material, and the anode is made of an opaque conductive material.

The third electrode layer is connected to the drain electrode of the thin film transistor, to receive a driving signal sent by the thin film transistor. The second electrode layer is connected to the third electrode layer, and is connected to the drain electrode of the thin film transistor through the third electrode layer, to receive the driving signal sent by the thin film transistor.

The organic light emitting diode array substrate according to embodiments of the present disclosure may include multiple pixel units. Each of the multiple pixel units may include the first electrode layer, the first light emitting layer, the second electrode layer, the thin film transistor, the third electrode layer, the second light emitting layer, and the fourth electrode layer as described above. The first organic light emitting diode including the first electrode layer, the first light emitting layer and the second electrode layer is used to achieve a front display or a back display, and correspondingly, the second organic light emitting diode including the third electrode layer, the second light emitting layer and the fourth electrode layer is used to achieve a back display or a front display.

Based on the above-described connection relationship, two organic light emitting diodes in each pixel unit of the organic light emitting diode array substrate for double-sided displaying are driven by one thin film transistor to emit lights; hence, compared with the organic light emitting diode array substrate for double-sided displaying in the related technologies, the number of required thin film transistors is reduced by one, and accordingly, the thickness and production cost are reduced. Moreover, an aperture ratio of the organic light emitting diode array substrate for double-sided displaying may be increased since the number of required thin film transistors in each pixel unit is reduced by one.

The thin film transistor according to the embodiments of the present disclosure may be a top-gate thin film transistor, of which the gate electrode is arranged between the active layer and the source electrode/drain electrode; alternatively, the thin film transistor may be a bottom-gate thin film transistor, of which the active layer is arranged between the gate electrode and the source electrode/drain electrode.

The active layer is made of a semiconductive material, and is sensitive to light, especially in a case that the semiconductive material is a low temperature polysilicon. In a case that the thin film transistor is the bottom-gate thin film transistor, the gate electrode made of a metallic material may shield external lights to some extend and the external lights have less effect on the active layer. In a case that the thin film transistor is the top-gate thin film transistor, the gate electrode is not located between the base substrate and the active layer; hence, a light shielding layer is arranged to shield the active layer from light. That is, the organic light emitting diode array substrate may further include a light shielding layer arranged between the base substrate and the active layer of the top-gate thin film transistor, to shield the active layer of the thin film transistor from light. In order that the active layer is shielded entirely by the light shielding layer, a region of an orthographic projection of the active layer onto the base substrate is entirely located within a region of an orthographic projection of the light shielding layer onto the base substrate. The light shielding layer is made of an opaque material, such as an opaque metallic material.

Optionally, in a case that the organic light emitting diode array substrate includes the light shielding layer made of a conductive material, the second electrode layer may be arranged at a layer identical to the light shielding layer, thereby reducing the thickness of the organic light emitting diode array substrate. Furthermore, the second electrode layer may be arranged at a layer and made of a material identical to the light shielding layer; hence, the second electrode layer and the light shielding layer can be formed by one patterning process and the production processes of the organic light emitting diode array substrate are simplified.

In some embodiments of the present disclosure, the third electrode layer is made of an opaque conductive material, such as a metallic material, and the third electrode layer is connected to the drain electrode of the thin film transistor. In a case that the third electrode layer and the drain electrode of the thin film transistor are arranged at different layers, an insulating layer is arranged between the third electrode layer and the drain electrode of the thin film transistor, and the third electrode layer and the drain electrode of the thin film transistor are connected through a via hole in the insulating layer. With such structure, the organic light emitting diode array substrate has a large thickness, and the production processes are complex. In view of the above, optionally, the third electrode layer may be arranged at a layer identical to the source electrode and the drain electrode of the thin film transistor, no via hole is needed, and the third electrode layer may be directly connected to the drain electrode of the thin film transistor; thereby reducing the thickness of the organic light emitting diode array substrate and simplifying the production processes. Furthermore, the third electrode layer may be arranged at a layer and made of a material identical to the source electrode and the drain electrode of the thin film transistor; hence, the third electrode layer and the source electrode and the drain electrode of the thin film transistor may be formed by one patterning process and the production processes of the organic light emitting diode array substrate are simplified.

In the above-described embodiments, the second electrode layer is connected to the third electrode layer through a via hole which passes through each layer between the second electrode layer and the third electrode layer.

In the following, specific implementations of the present disclosure are described in detail in conjunction with the drawings and embodiments. The embodiments below are used to illustrate the present disclosure, but not to limit the scope of the present disclosure.

Reference is made to FIG. 2, which is a schematic structural diagram of an organic light emitting diode array substrate for double-sided displaying according to some embodiments of the present disclosure. The organic light emitting diode array substrate includes a base substrate 301, a first electrode layer 302, a first pixel isolation layer 303, a first light emitting layer 304, a light shielding layer 3051, a second electrode layer 3052, a buffer layer 306, an active layer 307, a gate insulating layer 308, a gate electrode 309, a dielectric interlayer 310, a source electrode 3111, a drain electrode 3112, a third electrode layer 3113, a second pixel isolation layer 312, a second light emitting layer 313 and a fourth electrode layer 314.

The first electrode layer 302 is arranged on the base substrate 301.

The first pixel isolation layer 303 is arranged on the first electrode layer 302. The first pixel isolation layer 303 includes multiple first pixel isolators, and openings are formed between the adjacent first pixel isolators. The first pixel isolation layer 303 is used to define different pixel units.

The first light emitting layer 304 is arranged in the openings of the first pixel isolation layer 303.

The second electrode layer 3052 is arranged on the first light emitting layer 304, the light shielding layer 3051 is arranged on the first pixel isolation layer 303, and an upper surface of the second electrode layer 3052 is flush with an upper surface of the light shielding layer 3051. Optionally, the second electrode layer 3052 and the light shielding layer 3051 are made of the same material, and may be formed by one patterning process.

The second electrode layer 3052 and the light shielding layer 3051 are covered by the buffer layer 306.

The active layer 307 is arranged on the buffer layer 306, and a region of an orthographic projection of the active layer 307 onto the base substrate 301 is entirely located within a region of an orthographic projection of the light shielding layer 3051 onto the base substrate 301. In some embodiments of the present disclosure, the active layer 307 is a low temperature polysilicon active layer.

The gate electrode 309 is arranged on the gate insulating layer 308. In the embodiments of the present disclosure, a thin film transistor has two gate electrodes. Since the active layer is the low temperature polysilicon active layer and a leakage current of the low temperature polysilicon active layer is larger than that of a conventional amorphous silicon active layer, the influence of the leakage current on the display stability is reduced by controlling conduction in the active layer using two gate electrodes. As a matter of course, in other embodiments of the present disclosure, such as embodiments in which an amorphous silicon layer is used as the active layer, even, in the embodiments in which a low temperature polysilicon layer is used as the active layer, the thin film transistor may have only one gate electrode.

The source electrode 3111 and the drain electrode 3112 are respectively connected to the active layer 307 through via holes passing through the dielectric interlayer 310 and the gate insulating layer 308, the drain electrode 3112 is connected to the third electrode layer 3113, and the third electrode layer 3113 is connected to the second electrode layer 3052 through a via hole passing through the dielectric interlayer 310, the gate insulating layer 308 and the buffer layer 306. Upper surfaces of the source electrode 3111, the drain electrode 3112 and the third electrode layer 3113 are flush with each other. Optionally, the source electrode 3111, the drain electrode 3112 and the third electrode layer 3113 are made of the same material, and may be formed by one patterning process.

The second pixel isolation layer 312 includes multiple second pixel isolators, and openings are formed between the adjacent second pixel isolators.

The second light emitting layer 313 is arranged in the openings of the second pixel isolation layer 312.

The fourth electrode layer 314 is arranged on the second light emitting layer 313.

As shown in FIG. 2, the arrows indicate directions of lights emitted by the organic light emitting diode array substrate for double-sided displaying.

The light emission of the first light emitting layer 304 is controlled by the first electrode layer 302 and the second electrode layer 3052. That is, a first organic light emitting diode includes the first electrode layer 302, the first light emitting layer 304 and the second electrode layer 3052, the first electrode layer 302 serves as a cathode of the first organic light emitting diode, and the second electrode layer 3052 serves as an anode of the first organic light emitting diode. The first organic light emitting diode emits light from one side, the cathode of the first organic light emitting diode is made of a transparent conductive material or a translucent conductive material, and the anode of the first organic light emitting diode is made of an opaque conductive material.

The light emission of the second light emitting layer 313 is controlled by the third electrode layer 3113 and the fourth electrode layer 314. That is, a second organic light emitting diode includes the third electrode layer 3113, the second light emitting layer 313 and the fourth electrode layer 314, the third electrode layer 3113 serves as an anode of the second organic light emitting diode, and the fourth electrode layer 314 serves as a cathode of the second organic light emitting diode. The second organic light emitting diode emits light from one side, the cathode of the second organic light emitting diode is made of a transparent conductive material or a translucent conductive material, and the anode of the second organic light emitting diode is made of an opaque conductive material.

The third electrode layer 3113 is connected to the drain electrode 3112 of the thin film transistor, to receive a driving signal sent by the thin film transistor. The second electrode layer 3052 is connected to the third electrode layer 3113, and is connected to the drain electrode 3112 of the thin film transistor through the third electrode layer 3113, to receive the driving signal sent by the thin film transistor.

The organic light emitting diode array substrate according to the embodiments of the present disclosure may include multiple pixel units. Each of the multiple pixel units includes the first electrode layer 302, the first light emitting layer 304, the second electrode layer 3052, the thin film transistor, the third electrode layer 3113, the second light emitting layer 313, and the fourth electrode layer 314. The first organic light emitting diode including the first electrode layer 302, the first light emitting layer 304 and the second electrode layer 3052 is used to achieve a back display, and the second organic light emitting diode including the third electrode layer 3113, the second light emitting layer 313 and the fourth electrode layer 314 is used to achieve a front display.

Based on the above-described connection relationship, two organic light emitting diodes in each pixel unit of the organic light emitting diode array substrate for double-sided displaying are driven by one thin film transistor to emit lights; hence, compared with the organic light emitting diode array substrate for double-sided displaying in the related technologies, the number of thin film transistors in each pixel unit is reduced by one, and accordingly, the thickness and production cost are reduced. Moreover, an aperture ratio of the organic light emitting diode array substrate for double-sided displaying may be increased since the number of thin film transistors in each pixel unit is reduced by one.

Furthermore, an upper surface of the second electrode layer 3052 is flush with an upper surface of the light shielding layer 3051, the second electrode layer 3052 may be made of a material identical to the light shielding layer 3051, and the second electrode layer 3052 and the light shielding layer 3051 may be formed by one patterning process. An upper surface of the third electrode layer 3113 is flush with upper surfaces of the source electrode 3111 and the drain electrode 3112 of the thin film transistor, the third electrode layer 3113, the source electrode 3111 and the drain electrode 3112 may be made of the same material, and may be formed by one patterning process. Therefore, the thickness of the organic light emitting diode array substrate may be further reduced, the production processes are simplified and the production cost is reduced.

An organic light emitting diode display device is further provided according to some embodiments of the present disclosure, which includes the organic light emitting diode array substrate according to any one of the above-described embodiments.

A method for manufacturing an organic light emitting diode array substrate is further provided in the present disclosure, which includes: step S11, preparing a base substrate; and step S12, forming a first electrode layer on the base substrate, and forming a first light emitting layer, a second electrode layer, a thin film transistor, a third electrode layer, a second light emitting layer, and a fourth electrode layer. A drain electrode of the thin film transistor is connected to the third electrode layer, the third electrode layer is connected to the second electrode layer, the light emission of the first light emitting layer is controlled by the first electrode layer and the second electrode layer, and the light emission of the second light emitting layer is controlled by the third electrode layer and the fourth electrode layer.

The light emission of the first light emitting layer is controlled by the first electrode layer and the second electrode layer. That is, a first organic light emitting diode includes the first electrode layer, the first light emitting layer and the second electrode layer, the first electrode layer serves as a cathode of the first organic light emitting diode, and the second electrode layer serves as an anode of the first organic light emitting diode. The first organic light emitting diode emits light from one side, the cathode of the first organic light emitting diode is made of a transparent conductive material or a translucent conductive material, and the anode of the first organic light emitting diode is made of an opaque conductive material.

The light emission of the second light emitting layer is controlled by the third electrode layer and the fourth electrode layer. That is, a second organic light emitting diode includes the third electrode layer, the second light emitting layer and the fourth electrode layer, the third electrode layer serves as an anode of the second organic light emitting diode, and the fourth electrode layer serves as a cathode of the second organic light emitting diode. The second organic light emitting diode emits light from one side, the cathode of the second organic light emitting diode is made of a transparent conductive material or a translucent conductive material, and the anode of the second organic light emitting diode is made of an opaque conductive material.

The third electrode layer is connected to the drain electrode of the thin film transistor, to receive a driving signal sent by the thin film transistor. The second electrode layer is connected to the third electrode layer, and is connected to the drain electrode of the thin film transistor through the third electrode layer, to receive the driving signal sent by the thin film transistor.

The organic light emitting diode array substrate according to the embodiments of the present disclosure may include multiple pixel units. Each of the multiple pixel units includes the first electrode layer, the first light emitting layer, the second electrode layer, the thin film transistor, the third electrode layer, the second light emitting layer, and the fourth electrode layer. The first organic light emitting diode including the first electrode layer, the first light emitting layer and the second electrode layer is used to achieve a front display or a back display, and correspondingly, the second organic light emitting diode including the third electrode layer, the second light emitting layer and the fourth electrode layer is used to achieve a back display or a front display.

With the method according to the above-described embodiments, only one thin film transistor needs to be provided in each pixel unit to drive two organic light emitting diodes to emit lights; hence, compared with production processes of an organic light emitting diode array substrate for double-sided displaying in the related technologies, the number of thin film transistors required in each pixel unit is reduced by one. Accordingly, the production processes are simplified, that is, the organic light emitting diode array substrate for double-sided displaying can be manufactured by simple production processes.

Optionally, before forming the thin film transistor, the method further includes: forming a light shielding layer above the base substrate to shield an active layer of the thin film transistor from light. After the active layer of the thin film transistor is formed, a region of an orthographic projection of the active layer onto the base substrate is entirely located within a region of an orthographic projection of the light shielding layer onto the base substrate.

Optionally, the light shielding layer and the second electrode layer are formed by one patterning process, which simplifies the production processes of the organic light emitting diode array substrate.

Optionally, the source electrode and the drain electrode of the thin film transistor and the third electrode layer are formed by one patterning process, which simplifies the production processes of the organic light emitting diode array substrate.

In the following, the method for manufacturing the organic light emitting diode array substrate according to the embodiments of the present disclosure is described in detail based on a case that the thin film transistor is a top-gate thin film transistor.

Specifically, the step S12 of forming a first electrode layer on the base substrate, and forming a first light emitting layer, a second electrode layer, a thin film transistor, a third electrode layer, a second light emitting layer, and a fourth electrode layer may include followings steps S121 to S133.

In step S121, the first electrode layer is formed on the base substrate.

In step S122, a first pixel isolation layer is formed on the first electrode layer. The first pixel isolation layer includes multiple first pixel isolators, and openings are formed between the adjacent first pixel isolators.

In step S123, the first light emitting layer is formed in the openings of the first pixel isolation layer.

In step S124, the second electrode layer and a light shielding layer are formed by one patterning process. The second electrode layer is located on the first light emitting layer, and the light shielding layer is arranged in a region where an active layer is to be formed.

In step S125, a buffer layer is formed on the second electrode layer and the light shielding layer.

In step S126, an active layer is formed on the buffer layer. A region of an orthographic projection of the active layer onto the base substrate is entirely located within a region of an orthographic projection of the light shielding layer onto the base substrate.

In step S127, a gate insulating layer is formed on the active layer and the buffer layer.

In step S128, a gate electrode is formed on the gate insulating layer.

In step S129, a dielectric interlayer is formed on the gate insulating layer and the gate electrode, via holes passing through the dielectric interlayer and the gate insulating layer are formed, and a via hole passing through the dielectric interlayer, the gate insulating layer and the buffer layer is formed.

In step S130, a source electrode, a drain electrode and the third electrode layer are formed by one patterning process. The source electrode and the drain electrode are respectively connected to the active layer through the via holes passing through the dielectric interlayer and the gate insulating layer, the drain electrode is connected to the third electrode layer, and the third electrode layer is connected to the second electrode layer through the via hole passing through the dielectric interlayer, the gate insulating layer and the buffer layer.

In step S131, a second pixel isolation layer is formed on the dielectric interlayer, the source electrode, the drain electrode and the third electrode layer. The second pixel isolation layer includes multiple second pixel isolators, and openings are formed between the adjacent second pixel isolators.

In step S132, the second light emitting layer is formed in the openings of the second pixel isolation layer.

In step S133, the fourth electrode layer is formed on the second light emitting layer.

With the above-described manufacturing method, the second electrode layer and the light shielding layer are formed by one patterning process, and the third electrode layer and the source electrode and the drain electrode of the thin film transistor are formed by one patterning process, thereby simplifying the production processes and reducing the production cost.

The forgoing descriptions are only the preferred embodiments of the present disclosure, and it should be noted that numerous improvements and modifications made to the present disclosure can further be made by those skilled in the art without being departing from the principle of the present disclosure, and those improvements and modifications shall fall into the scope of protection of the present disclosure.

The invention claimed is:

1. An organic light emitting diode array substrate, comprising: a base substrate, a first electrode layer, a first light emitting layer, a second electrode layer, a third electrode layer, a second light emitting layer, and a fourth electrode layer; wherein in each pixel unit, the organic light emitting diode array substrate comprises only one thin film transistor, a drain electrode of the thin film transistor is connected to the third electrode layer, the third electrode layer is connected to the second electrode layer, light emission of the first light emitting layer is controlled by the first electrode layer and the second electrode layer, and light emission of the second light emitting layer is controlled by the third electrode layer and the fourth electrode layer,
wherein a light shielding layer that is configured to shield an active layer of the thin film transistor from light is arranged between the base substrate and the active layer of the thin film transistor, a region of an orthographic projection of the active layer onto the base substrate is entirely located within a region of an orthographic projection of the light shielding layer onto the base substrate, and
wherein an upper surface of the second electrode layer is flush with an upper surface of the light shielding layer, and the second electrode layer is made of a material identical to the light shielding layer.

2. The organic light emitting diode array substrate according to claim 1, wherein an upper surface of the third electrode layer is flush with upper surfaces of a source electrode and the drain electrode of the thin film transistor, and the third electrode layer, the source electrode and the drain electrode of the thin film transistor are made of an identical material.

3. The organic light emitting diode array substrate according to claim 1, wherein the second electrode layer is connected to the third electrode layer through a via hole.

4. The organic light emitting diode array substrate according to claim 1, wherein each of the first light emitting layer and the second light emitting layer emits light from a single side, and a direction of the light emitted by the first light emitting layer is opposite to a direction of the light emitted by the second light emitting layer.

5. The organic light emitting diode array substrate according to claim 1, wherein the first electrode layer is made of a transparent conductive material or a translucent conductive material, and the second electrode layer is made of an opaque conductive material.

6. The organic light emitting diode array substrate according to claim 1, wherein the fourth electrode layer is made of a transparent conductive material or a translucent conductive material, and the third electrode layer is made of an opaque conductive material.

7. The organic light emitting diode array substrate according to claim 1, further comprising: a first pixel isolation layer, a light shielding layer, a buffer layer, an active layer, a gate insulating layer, a gate electrode, a dielectric interlayer, a source electrode, a drain electrode and a second pixel isolation layer;
wherein the first electrode layer is arranged on the base substrate;
the first pixel isolation layer is arranged on the first electrode layer and comprises a plurality of first pixel isolators and openings formed between the adjacent first pixel isolators;
the first light emitting layer is arranged in the openings of the first pixel isolation layer;

an upper surface of the second electrode layer is flush with an upper surface of the light shielding layer, and the second electrode layer is arranged on the first light emitting layer;

the buffer layer is arranged on the second electrode layer and the light shielding layer;

the active layer is arranged on the buffer layer, and a region of an orthographic projection of the active layer onto the base substrate is entirely located within a region of an orthographic projection of the light shielding layer onto the base substrate;

the gate insulating layer is arranged on the active layer and the buffer layer;

the gate electrode is arranged on the gate insulating layer;

the dielectric interlayer is arranged on the gate insulating layer and the gate electrode;

upper surfaces of the source electrode, the drain electrode and the third electrode layer are flush with each other, the source electrode and the drain electrode are respectively connected to the active layer through via holes passing through the dielectric interlayer and the gate insulating layer, the drain electrode is connected to the third electrode layer, and the third electrode layer is connected to the second electrode layer through a via hole passing through the dielectric interlayer, the gate insulating layer and the buffer layer;

the second pixel isolation layer is arranged on the dielectric interlayer, the source electrode, the drain electrode and the third electrode layer and comprises a plurality of second pixel isolators and openings formed between the adjacent second pixel isolators;

the second light emitting layer is arranged in the openings of the second pixel isolation layer; and the fourth electrode layer is arranged on the second light emitting layer.

8. An organic light emitting diode display device, comprising an organic light emitting diode array substrate, wherein the organic light emitting diode array substrate comprises a base substrate, a first electrode layer, a first light emitting layer, a second electrode layer, a third electrode layer, a second light emitting layer, and a fourth electrode layer; wherein in each pixel unit, the organic light emitting diode array substrate comprises only one thin film transistor, a drain electrode of the thin film transistor is connected to the third electrode layer, the third electrode layer is connected to the second electrode layer, light emission of the first light emitting layer is controlled by the first electrode layer and the second electrode layer, and light emission of the second light emitting layer is controlled by the third electrode layer and the fourth electrode layer, wherein a light shielding layer that is configured to shield an active layer of the thin film transistor from light is arranged between the base substrate and the active layer of the thin film transistor, a region of an orthographic projection of the active layer onto the base substrate is entirely located within a region of an orthographic projection of the light shielding layer onto the base substrate, and wherein an upper surface of the second electrode layer is flush with an upper surface of the light shielding layer, and the second electrode layer is made of a material identical to the light shielding layer.

* * * * *